(12) United States Patent (10) Patent No.: US 8,867,213 B2
Furuta et al. (45) Date of Patent: Oct. 21, 2014

(54) SERVER RACK COMPONENT WITH QUICK RELEASE MECHANISM

(75) Inventors: Steven J. Furuta, Santa Clara, CA (US); Michael Wittig, Santa Clara, CA (US); Amir Meir Michael, San Mateo, CA (US)

(73) Assignee: Facebook, Inc., Mountain View, CA (US)

( * ) Notice: Subject to any disclaimer, the term of this patent is extended or adjusted under 35 U.S.C. 154(b) by 292 days.

(21) Appl. No.: 13/029,463

(22) Filed: Feb. 17, 2011

(65) Prior Publication Data

US 2012/0212905 A1  Aug. 23, 2012

(51) Int. Cl.
*H05K 5/00* (2006.01)
*H05K 7/00* (2006.01)
*G11B 33/02* (2006.01)
*A47B 81/00* (2006.01)
*G06F 1/18* (2006.01)
*H05K 7/14* (2006.01)

(52) U.S. Cl.
CPC .............. *G06F 1/183* (2013.01); *H05K 7/1489* (2013.01)
USPC .................. 361/724; 361/679.37; 361/679.39; 361/727; 361/732; 369/75.11; 369/75.21; 369/77.11; 312/223.2

(58) Field of Classification Search
USPC ............... 361/679.31–679.4, 679.41–679.49, 361/679.55–679.6, 724–733; 439/157, 60, 439/152–153, 327, 328, 331; 1/679.31–679.4, 679.41–679.49, 1/679.55–679.6, 724–733
See application file for complete search history.

(56) References Cited

U.S. PATENT DOCUMENTS 6,288,902 B1 * 9/2001 Kim et al. ..................... 361/725
6,442,030 B1 * 8/2002 Mammoser et al. .......... 361/727
2005/0265004 A1 * 12/2005 Coglitore et al. ............. 361/724

* cited by examiner

*Primary Examiner* — Jenny L Wagner
*Assistant Examiner* — Jerry Wu
(74) *Attorney, Agent, or Firm* — Fenwick & West LLP

(57) ABSTRACT

A quick lock and release mechanism is provided for securing and releasing a server or other computing asset, including a server tray, from a server rack. The server is equipped with a quick release tab that is biased to fit into an opening in the server rack. To install the server in the rack, the server is secured to the rack by aligning and inserting the quick release tab into the opening. The server can then be removed from the rack by retracting the quick release tab from the opening. The server rack may include a plurality of shelves cut out from the rack to hold multiple servers in the rack.

22 Claims, 3 Drawing Sheets

SERVER RACK COMPONENT WITH QUICK RELEASE MECHANISM

BACKGROUND

This invention relates generally to rack-mounted computing equipment, and in particular retention mechanisms for locking and releasing computing devices within a server rack.

Conventional computer servers and server trays require installation or mounting with screws to secure the server or tray to a rack. Each time a server or tray is installed in a rack, it must be screwed in place to the rack, and each time a server or tray is removed, it must be unscrewed from the rack. In some cases, the server is installed by rails that are screwed into the exterior side of the server and the interior of the rack. The installation and removal of the server or tray from the rack can be time-consuming and cumbersome, which is magnified by the large number of servers in a typical data center. The process can also be expensive if a technician is paid for the time spent to install or remove the server or server tray from the rack. Thus, there is a need for an efficient and quick removal and retention mechanism for servers in racks.

SUMMARY

To enhance the efficiency of the installation and removal of servers from server racks, embodiments of the invention provide a quick lock and release mechanism for securing and releasing a server or server tray to and from a rack. The server or server tray includes a quick release tab that reversibly extends from the side of the server or tray. The quick release tab aligns with an opening in the server rack so that it can be inserted into the opening. The insertion of the quick release tab into the opening secures the server or server tray to the rack. The quick release tab is easily removed or retracted from the opening to release the server or tray from the rack.

In some embodiments, the server rack comprises a plurality of shelves that extend from the rack. In one embodiment, the shelf is a cut-out from the side panel of the rack that extends into the interior of the rack. The server or server tray is placed on the plurality of shelves to hold the server or tray in the rack.

In another embodiment, the server or server tray comprises an extended portion that protrudes from the back of the server or tray into the rack. The rack includes a receiving portion that is configured to fit with the extended portion and secure the back of the server or tray to the rack.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
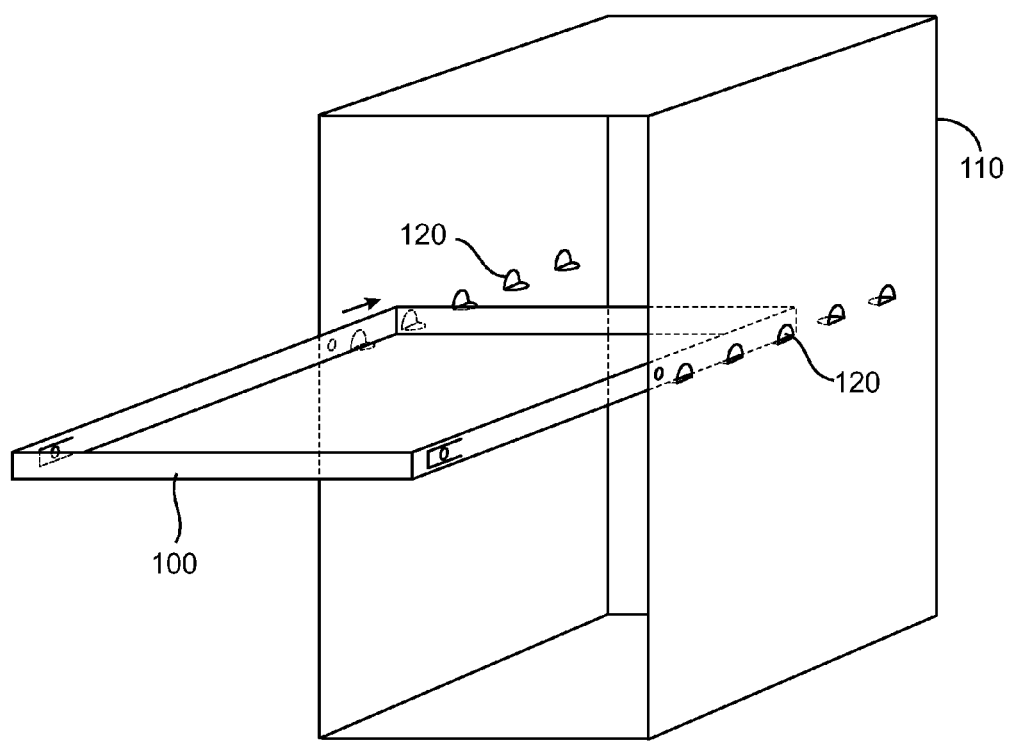
FIG. 1 is perspective view of a server rack and a server, according to one embodiment of the invention.

Embodiments of the invention include quick release and retention mechanisms for various computing devices that are stored in racks. FIG. 1 shows an example of a computing device and a rack 110. Computing devices can include any type of device, chassis, or asset that is used in computing systems and housed in a rack 110. A server 100 is a type of computing device that is housed in the rack 110. A server 100 is a central computer or group of computers dedicated to sending and receiving data from other computers on a network. A server 100 can be secured directly to the rack 110 or placed on a tray which is secured to the rack 110. A tray is a housing or enclosure that is used to hold the server 100 in the rack 110. In one embodiment, the tray can be a metal sheet that fits across the interior of the rack 110. As used herein, a server 100 refers to any computing device that can be secured to the rack 110. The embodiments described herein with respect to a server 100 can also be applied to a tray or chassis that houses the server 100.

In some embodiments, a rack 110 includes a plurality of shelves 120 for holding the server 100 or tray. In one embodiment, the shelves 120 are "punch-outs" or "cut-outs" of the side panel of the rack 110 and extend into the interior of the rack 110. In one embodiment, the shelf 120 is a partial cut-out of the side panel of the rack 110, and the cut-out portion is bent inward to form a rigid extension. In another embodiment, the shelf 120 is perpendicular to the side panel of the rack 110. In some embodiments, the shelf 120 can be various cut-outs or extensions of different sizes or shapes from the side of the rack 110. In other embodiments, the shelves 120 are extensions that are built into the interior of the rack 110. In certain embodiments, the shelves 120 are aligned in a straight row and extend out from the side panels of the rack 110. As shown in FIG. 1, the plurality of shelves 120 can be situated on opposite sides of the rack 110 (i.e., on opposing side wall panels) and are aligned in the same horizontal plane.

In another embodiment, the server 100 or tray slides on top of the shelves 120 into the rack 110. The weight of the server 100 is held up by the plurality of shelves 120 that extend into the interior of the rack 110. In some embodiments, the shelves 120 act as a type of rail that keeps the server 100 in a level position and retains the server 100 in the rack 110.

Figure 2A:
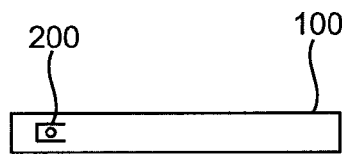
FIG. 2A is a side view of a server rack and a server, according to one embodiment of the invention.
Figure 2A:
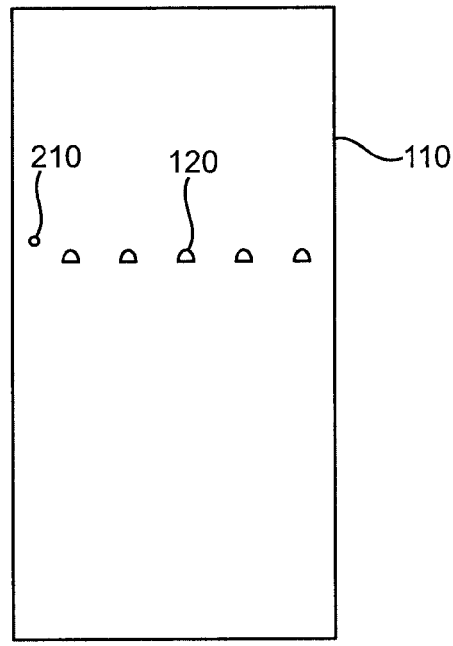

Referring now to FIG. 2A, a side view is shown of the insertion of the server 100 into the rack 110. The server 100 includes a quick release tab 200 that couples the server 100 to the rack 110. In one embodiment, the quick release tab 200 aligns with and inserts into an opening 210 in the rack 110. In some embodiments, the opening 210 can be a hole, gap, or cut-out of various shapes or sizes. In one embodiment, the opening 210 is configured to have the approximate size and shape of the quick release tab 200. In another embodiment, the quick release tab 200 is situated on the front side panel of the server 100 and the opening 210 is situated near the front end of the rack 110.

In some embodiments, the quick release tab 200 comprises a tab that shortens or extends from the side of the server or tray by pressing, pushing, or pulling the tab. In other embodiments, the quick release tab 200 can be spring-loaded and can extend and shorten by release of an interior spring. In another embodiment, the tab 200 can be a resilient notch, peg, plunger, or protruding piece that can be extended and shortened by pulling, pressing, and/or pushing on the tab 200. In some embodiments, the quick release tab 200 has two configurations: an extended position and a retracted position.

Figure 2B:
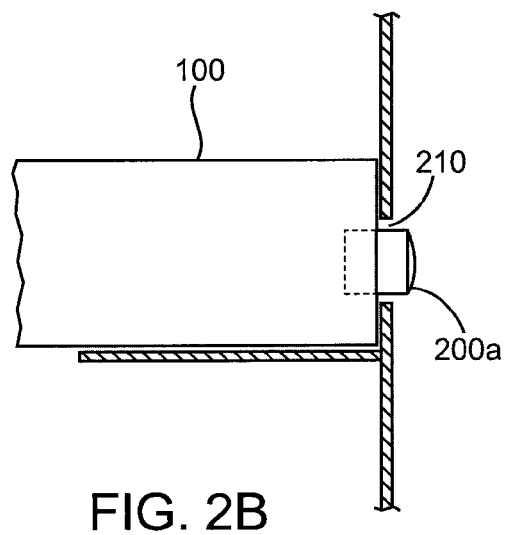
FIG. 2B is a front cut-through view of a server and a quick release tab, according to one embodiment of the invention.
Figure 2C:
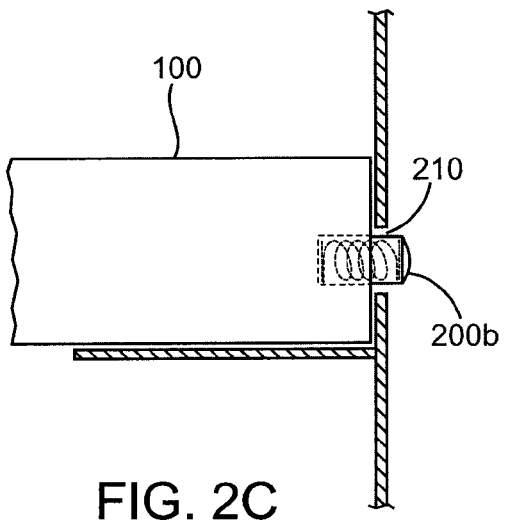
FIG. 2C is a front cut-through view of a server and a spring loaded tab, according to one embodiment of the invention.

In FIG. 2B, an example of the lock and release mechanism is depicted. An example quick release tab 200a is shown, which extends from the side of the server 100 and aligns with an opening 210 in the rack 110. When the server 100 is first inserted into the rack 110, the quick release tab 200 can be in a retracted position and does not extend out from the side of the server 100. When the quick release tab 200a aligns with the opening 210 in the rack, the quick release tab 200a can be inserted into the opening 210 to secure the server 100 to the rack. In one embodiment, the extension of the quick release tab 200a into the opening 210 locks the position of the server 100 in the rack 110. When the server 100 is to be removed from the rack 110, the quick release tab 200a can be retracted from the opening 210. In some embodiments, the quick release tab 200a can be pushed back into the server 100.

In another embodiment, an example of a spring-loaded tab 200b is shown. The spring-loaded tab 200b can be extended or shortened from the side of the server 100 or tray (e.g., inserted or removed from the opening 210) based on the movement of an internal spring. The spring loaded tab 200b aligns with the opening 210 in the rack 110. The spring loaded tab 200b is released or extended into the opening 210 to secure the server 100 to the rack 110. In some embodiments, the spring loaded tab is arranged to move against a spring force to remove the spring loaded tab from the opening 210. In some embodiments, a spring-loaded plunger can be used.

In another embodiment, the quick release tab 200 comprises a resilient notch. The notch can be easily extended from the side of the server 100 to insert into the opening 210 in the rack 110 and to secure the server 100. The notch can be drawn back into the server 100 or retracted from the opening 210 to release the server 100 from the rack 110.

Various other types and designs of tabs 200 can be used to achieve the lock and release mechanism described herein. One of skill in the art may alter the tab 200 and opening 210 without departing from the spirit and scope of the invention.

Figure 3:
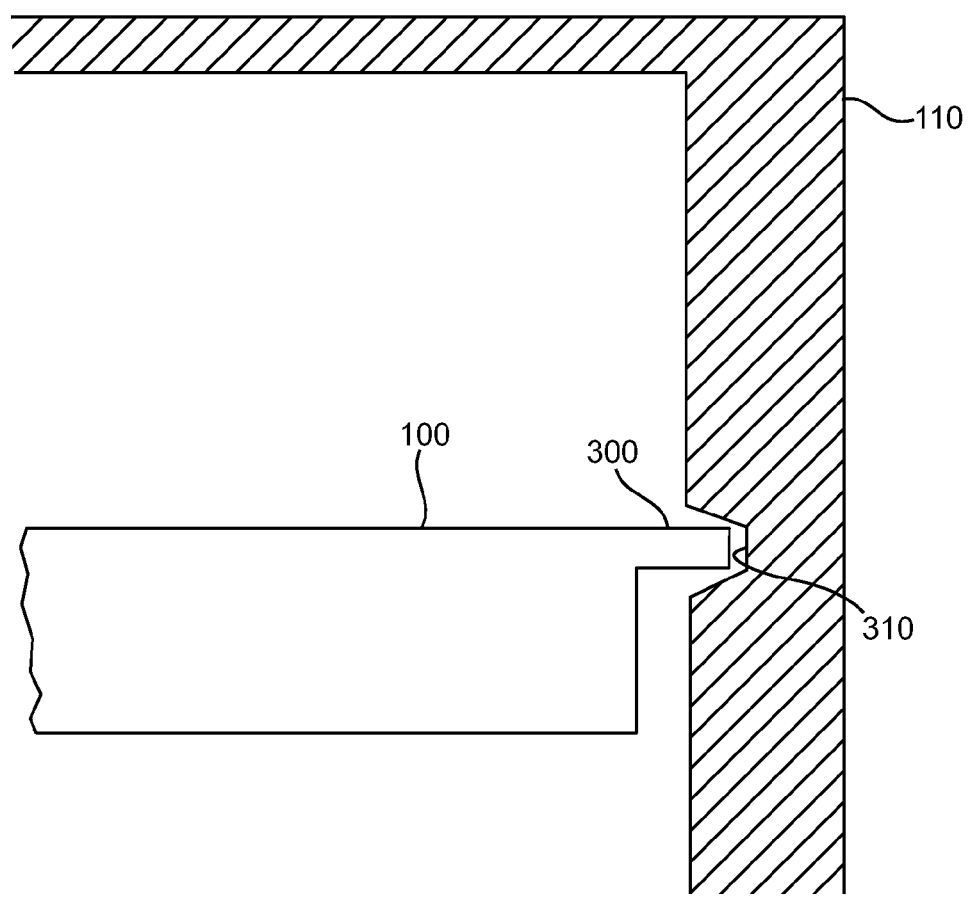
FIG. 3 is a side cut-through view of a server and a rack, according to one embodiment of the invention.

In FIG. 3, the server 100 or tray can include a retention mechanism in the back of the server 100 or tray. In one embodiment, the server 100 has an extendable portion 300 that protrudes out of the server 100 or tray. The extendable portion 300 may be a finger-like extension, a hook, or a jutting or protruding piece. The extendable portion 300 inserts into a slot 310 in the back of the rack 110. In some embodiments, the slot 310 comprises a hole, gap, cut-out or receiving portion that is configured to fit the extendable portion 300. The insertion of the extendable portion 300 into the slot 310 secures the server 100 to the back wall of the rack 110 and keeps it from pushing too far into the rack 110.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system for securing a server to a server rack, the system comprising:
the server for use in a computing system, the server comprising an extended portion; a quick release tab on each of two opposite sides of the server, wherein each quick release tab is reversibly extendable from the side of the server, configured to adopt an extended or a retracted position, and in the retracted position, each quick release tab is contained within the corresponding side of the server; and
the server rack for housing the server, the rack comprising: a back wall comprising a slot integrally forming a depression in the rack, the slot configured to fit the extended portion of the server, to prevent the server from pushing too far into the rack, to secure the server to the back wall of the rack when the server is installed in the rack, and to mechanically support the weight of the server; and two side walls located on opposite sides of the back wall respectively, each side wall comprising a plurality of cutouts; the plurality of cutouts are bent inward from the corresponding side walls of the rack and form a plurality of shelves for holding the server and an opening on each side wall for receiving the corresponding quick release tab.

2. The system of claim 1, wherein the quick release tab is capable of being refracted from the opening to release the server from the server rack by depressing the quick release tab.

3. The system of claim 1, wherein the quick release tab comprises a resilient notch.

4. The system of claim 1, wherein the quick release tab comprises a spring loaded plunger such that by pulling, pressing and/or pushing the quick release tab the server is quickly released from being locked to the server rack.

5. The system of claim 1, wherein the plurality of shelves comprise extensions that are cut out from a side panel of the server rack.

6. The system of claim 1, wherein the plurality of shelves are configured to receive and hold a server in the rack.

7. A system for securing a computing asset to a rack, the system comprising:
the computing asset for use in a computing system, the computing asset comprising an extended portion; an extendable tab on each of two opposite sides of the computing asset, each extendable tab reversibly extending from the computing asset and configured to adopt an extended or a retracted position, wherein in the retracted position, each extendable tab is contained within the corresponding side of the computing asset; and
the rack for holding the computing asset, the rack comprising: a back wall comprising a slot integrally forming a depression in the rack, the slot configured to fit the extended portion of the computing asset, to prevent the computing asset from pushing too far into the rack, to secure the computing asset to the back wall of the rack when the computing asset is installed in the rack, and to mechanically support the weight of the computing asset; and two side walls located on opposite sides of the back wall respectively, each side wall comprising a plurality of cutouts; the plurality of cutouts are bent inward from the corresponding side walls of the rack and form a plurality of shelves for holding the computing asset and an opening on each side wall for receiving the corresponding extendable tab of the computing asset placed on the shelves; wherein the insertion of the extendable tabs into the corresponding openings secures the computing asset to the rack.

8. The system of claim 7, wherein the extendable tab aligns with the opening in the rack when the computing asset is placed on the shelf of the rack.

9. The system of claim 7, wherein the extendable tab can be reversibly extended into the opening to secure the computing asset to the rack.

10. The system of claim 7, wherein the extendable tab is removed from the opening to release the computing asset from the rack.

11. The system of claim 7, wherein the extendable tab comprises a resilient notch that extends into and retracts from the opening.

12. The system of claim 7, wherein the extendable tab comprises a spring-loaded plunger that inserts into or retracts from the opening such that by pulling, pressing and/or pushing the extendable tab the computing asset is quickly released from being locked to the server rack.

13. The system of claim 7, wherein the computing asset comprises a tray that is configured to fit into the rack.

14. The system of claim 13, wherein the extendable tab is located on the side of the tray.

15. The system of claim 7, wherein the computing asset comprises a chassis.

16. The system of claim 15, wherein the extendable tab is located on the side of the chassis.

17. The system of claim 7, wherein the plurality of shelves in the rack are configured to receive a plurality of computing assets.

18. The system of claim 7, wherein the computing asset comprises a server.

19. The system of claim 1, wherein the extendable portion of the server comprises a finger-like extension, a hook, a jutting or a protruding piece.

20. The system of claim 1, wherein the slot of the rack comprises a hole, gap, cutout or receiving portion.

21. The system of claim 7, wherein the extendable portion of the server comprises a finger-like extension, a hook, a jutting or a protruding piece.

22. The system of claim 7, wherein the slot of the rack comprises a hole, gap, cutout or receiving portion.

* * * * *